(12) United States Patent
Lee

(10) Patent No.: US 10,847,629 B2
(45) Date of Patent: Nov. 24, 2020

(54) SEMICONDUCTOR DEVICE WITH AN OXYGEN SINK AND METHOD FOR FABRICATING THE SAME

(71) Applicant: SK hynix Inc., Gyeonggi-do (KR)

(72) Inventor: Eun-Sung Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/006,268

(22) Filed: Jun. 12, 2018

(65) Prior Publication Data

US 2019/0189765 A1 Jun. 20, 2019

(30) Foreign Application Priority Data

Dec. 18, 2017 (KR) ........................ 10-2017-0173944

(51) Int. Cl.
| | |
|---|---|
| *H01L 27/088* | (2006.01) |
| *H01L 29/423* | (2006.01) |
| *H01L 21/28* | (2006.01) |
| *H01L 21/8234* | (2006.01) |
| *H01L 23/00* | (2006.01) |

(52) U.S. Cl.
CPC .. *H01L 29/42376* (2013.01); *H01L 21/28026* (2013.01); *H01L 21/823456* (2013.01); *H01L 23/564* (2013.01); *H01L 27/088* (2013.01)

(58) Field of Classification Search
None
See application file for complete search history.

(56) References Cited

U.S. PATENT DOCUMENTS

| | | | |
|---|---|---|---|
| 9,178,017 B2 | 11/2015 | Saino | |
| 9,922,832 B1* | 3/2018 | Han | .................. H01L 27/11521 |
| 2009/0243725 A1* | 10/2009 | Abe | ...................... H01L 23/585 |
| | | | 330/277 |
| 2012/0100679 A1* | 4/2012 | Sridhar | ........... H01L 21/823462 |
| | | | 438/232 |
| 2013/0102138 A1* | 4/2013 | Yeh | ................... H01L 21/82380 |
| | | | 438/585 |
| 2014/0015022 A1 | 1/2014 | Onda | |
| 2016/0141420 A1* | 5/2016 | Chen | .................... H01L 29/7851 |
| | | | 257/343 |
| 2017/0250277 A1* | 8/2017 | Wu | ...................... H01L 29/1095 |

FOREIGN PATENT DOCUMENTS

KR 100919805 10/2009

* cited by examiner

*Primary Examiner* — Bilkis Jahan
(74) *Attorney, Agent, or Firm* — IP & T Group LLP

(57) ABSTRACT

A semiconductor device includes: a first transistor that includes a first gate stack; a second transistor that includes a second gate stack having a narrower width than the first gate stack; and a dummy gate stack disposed around the first gate stack and the second gate stack, wherein the dummy gate stack includes an oxygen sink layer for capturing oxygen atoms that are diffused from an exterior into the first gate stack and the second gate stack.

25 Claims, 10 Drawing Sheets

SEMICONDUCTOR DEVICE WITH AN OXYGEN SINK AND METHOD FOR FABRICATING THE SAME

CROSS-REFERENCE TO RELATED APPLICATIONS

The present application claims priority of Korean Patent Application No. 10-2017-0173944, filed on Dec. 18, 2017, which is incorporated herein by reference in its entirety.

BACKGROUND

1. Field

Exemplary embodiments of the present invention relate to a semiconductor device and a method for fabricating the same, and more particularly, to a transistor including a high-k material and a metal gate electrode, and a method for fabricating the transistor.

2. Description of the Related Art

As semiconductor devices come to operate at a low power source voltage and at a high speed, an HKMG (High-K Metal Gate) structure is suggested. A transistor having the HKMG structure may include a gate dielectric layer including a high-k material having a higher dielectric constant than a silicon oxide ($SiO_2$). Also, the HKMG transistor may include a gate electrode including a metal layer. The HKMG transistor may be able to suppress a gate leakage current while making an Equivalent Oxide Thickness (EOT) thin as the gate dielectric layer includes a high-k material. Also, the use of a gate electrode including a metal layer, may further improve the operation characteristics of the HKGM transistor.

SUMMARY

Embodiments of the present invention are directed to an improved semiconductor device capable of enhancing a threshold voltage uniformity of transistors having various widths, and a method for fabricating the semiconductor device. The transistors may preferably be HKMG transistors. Enhanced threshold voltage uniformity is highly desirable because, for example, improves the reliability of the transistors and their performance characteristics.

In accordance with an embodiment of the present invention, a semiconductor device may include: a first transistor that includes a first gate stack; a second transistor that includes a second gate stack having a narrower width than the first gate stack; and a dummy gate stack disposed around the first gate stack and the second gate stack, wherein the dummy gate stack includes an oxygen sink layer for capturing oxygen atoms that are diffused from an exterior into the first gate stack and the second gate stack.

Each of the first gate stack, the second gate stack, and the dummy gate stack may include an oxygen vacancy containing layer, and there may be no significant difference in the oxygen vacancy between the first gate stack and the second gate stack.

The dummy gate stack may be formed of the same material as materials of the first gate stack and the second gate stack.

Each of the first gate stack and the second gate stack may include an oxygen vacancy containing region and an oxygen vacancy curing region.

The oxygen vacancy curing region may be formed in a gate edge of each of the first gate stack and the second gate stack.

Each of the first gate stack, the second gate stack, and the oxygen sink layer may include a high-k material.

Each of the first gate stack, the second gate stack, and the oxygen sink layer may include $HfO_2$, HfSiO, HfSiON, or HfON.

Each of the first gate stack, the second gate stack, and the dummy gate stack may include a stacked structure where an interface layer, a high-k material, and a metal gate electrode are sequentially stacked, and the high-k material of the dummy gate stack may become the oxygen sink layer.

Each of the first gate stack, the second gate stack, and the dummy gate stack may include a stacked structure where an interface layer, a high-k material, a dipole inducing capping layer, and a metal gate electrode are sequentially stacked, and the high-k material of the dummy gate stack may become the oxygen sink layer.

The dummy gate stack may have a shape of surrounding the first gate stack and the second gate stack.

The dummy gate stack may be disposed to be spaced apart from the first gate stack and the second gate stack by approximately 1 nm to 100 nm.

The first gate stack and the second gate stack may have different gate lengths.

In accordance with another embodiment of the present invention, a method for fabricating a semiconductor device may include: forming an active gate stack over a semiconductor substrate; forming a dummy gate stack around the active gate stack; and performing a thermal treatment in an atmosphere of an oxygen gas to cure oxygen vacancies of the active gate stack, wherein the dummy gate stack includes an oxygen sink layer capturing oxygen atoms that are diffused from the atmosphere of the oxygen gas.

The forming of the active gate stack may include: forming a wide gate stack; and forming a narrow gate stack having a narrower width than the wide gate stack.

The dummy gate stack may be formed to have a shape of surrounding the active gate stack.

Each of the first gate stack, the second gate stack, and the oxygen sink layer may include an oxygen vacancy containing region, and a portion of the oxygen vacancies may be cured after the performing of the thermal treatment.

After the performing of the thermal treatment, the first gate stack and the second gate stack may include an oxygen vacancy containing region and an oxygen vacancy curing region, and the oxygen vacancy curing region may be formed to be limited to a gate edge of each of the first gate stack and the second gate stack.

Each of the first gate stack, the second gate stack, and the dummy gate stack may include a stacked structure where an interface layer, a high-k material, and a metal gate electrode are sequentially stacked.

Each of the first gate stack, the second gate stack, and the dummy gate stack may include a stacked structure where an interface layer, a high-k material, a dipole inducing capping layer, and a metal gate electrode are sequentially stacked.

The dummy gate stack may be disposed to be spaced apart from the first gate stack and the second gate stack by approximately 1 nm to 100 nm.

DETAILED DESCRIPTION

Figure 1A:
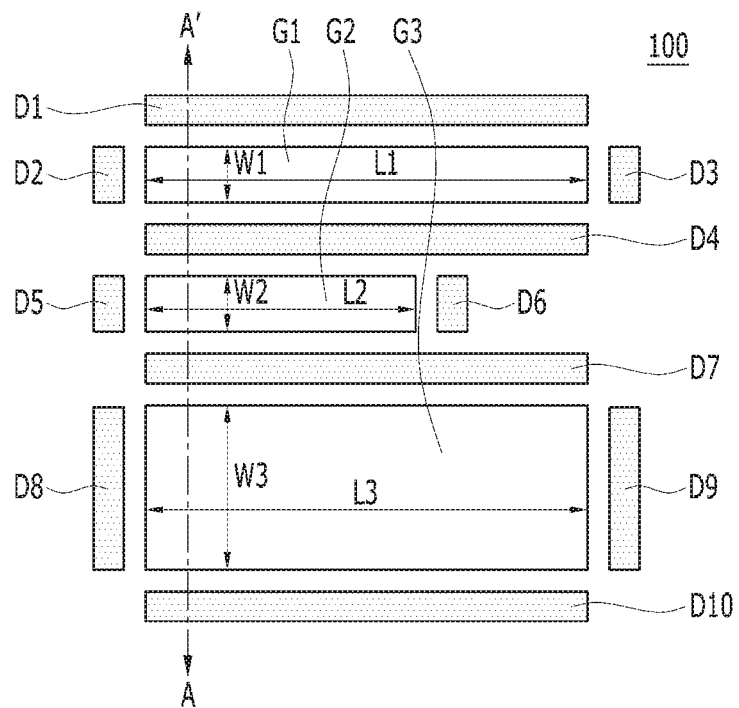
FIG. 1A is a plan view illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereafter, referring to the accompanying drawings, the embodiments of the present invention will be described in detail. Although a Dynamic Random Access Memory (DRAM) is described as an example in this specification of the present invention to simplify the description of the present invention, the concept and spirit of the present invention are not limited to it but they may be applied to other kinds of memories or semiconductor devices.

Hereafter, embodiments of the present invention provide a method for improving the reliability of a transistor and the on-chip uniformity of a threshold voltage when a HKMG (High-K Metal Gate) is formed through a Gate First Process.

The gate first process is a method of forming source/drain regions through an impurity ion implantation process and an activation annealing process after a gate dielectric layer and a gate electrode are formed. In the gate first process, a gate stack may include an interface layer, a gate dielectric layer, and a gate electrode. The interface layer may be formed of a silicon oxide ($SiO_2$), and the gate dielectric layer may be formed of a high-k material.

While the gate first process is performed, oxygen vacancies may be formed in the high-k material of the gate stack. The oxygen vacancies may deteriorate the reliability of Positive Biased Temperature Instability (PBTI). Also, a threshold voltage (Vt) shift may occur.

The oxygen vacancies may be cured into oxygen atoms during a subsequent annealing process. Herein, since an oxygen reaction ends at the edge of the gate, there may be a change in the characteristics due to a difference in the length and width of the gate. In short, the curing at the edge of the gate may become ununiform when the gates of different lengths and widths are concurrently exposed to the annealing process.

Embodiments of the present invention employ a dummy gate for consuming oxygen atoms. The dummy gate may suppress oxygen curing at the edge of the gate. As a result, the oxygen vacancy curing uniformity in the gates of different lengths and widths may be improved.

FIG. 1A is a plan view illustrating a semiconductor device in accordance with an embodiment of the present invention.

Referring to FIG. 1A, the semiconductor device 100 may include a plurality of active gates G1 to G3 and a plurality of gate dummies D1 to D10.

The active gates G1 to G3 may have different widths and lengths. A first active gate G1 may have a first width W1 and a first length L1. A second active gate G2 may have a second width W2 and a second length L2. A third active gate G3 may have a third width W3 and a third length L3. The first width W1 and the second width W2 may be the same, and the third width W3 may be longer than the first width W1 and the second width W2. The first length L1 and the third length L3 may be the same, and the second length L2 may be shorter than the first length L1 and the third length L3. As described above, the active gates G1 to G3 may include a narrow gate and a wide gate. The narrow gate may refer to an active gate with a narrow width, and the wide gate may refer to an active gate with a wide width. The first active gate G1 and the second active gate G2 may be narrow gates. The third active gate G3 may be a wide gate.

The gate dummies D1 to D10 may have different sizes or the same size. The gate dummies D1 to D10 may be separated from each other. In other words, the gate dummies D1 to D10 may be spaced apart from each other by a predetermined gap. The gate dummies D1 to D10 may be of an irregular shape.

The gate dummies D1 to D10 may be electrically insulated from the active gates G1 to G3. The gap between the gate dummies D1 to D10 and the active gates G1 to G3 may be between approximately 1 nm to approximately 100 nm.

The gate dummies D1 to D10 may be arranged to surround the active gates G1 to G3. To be specific, first to fourth gate dummies D1 to D4 may surround the first active gate, i.e., the first to fourth gate dummies D1 to D4 may be disposed around the first active gate G1. The first to fourth gate dummies D1 to D4 may be arranged to form a discontinuous pattern. The fourth to seventh gate dummies D4 to D7 may be disposed around the second active gate G2. The fourth to seventh gate dummies D4 to D7 may be arranged to form a discontinuous pattern. The seventh to $10^{th}$ gate dummies D7 to D10 may be disposed around the third active gate G3. The seventh to $10^{th}$ gate dummies D7 to D10 may be arranged to form a discontinuous pattern.

The active gates G1 to G3 and the gate dummies D1 to D10 may be formed by the same process. The active gates G1 to G3 and the gate dummies D1 to D10 may be formed of the same material. The active gates G1 to G3 and the gate dummies D1 to D10 may be formed of different materials. For example, the active gates G1 to G3 may include a stack of a dielectric material and a conductive material. The gate dummies D1 to D10 may include a stack of a dielectric material and a conductive material.

The first to third active gates G1 to G3 may be formed of the same material. The first to $10^{th}$ gate dummies D1 to D10 may be formed of the same material.

Figure 1B:
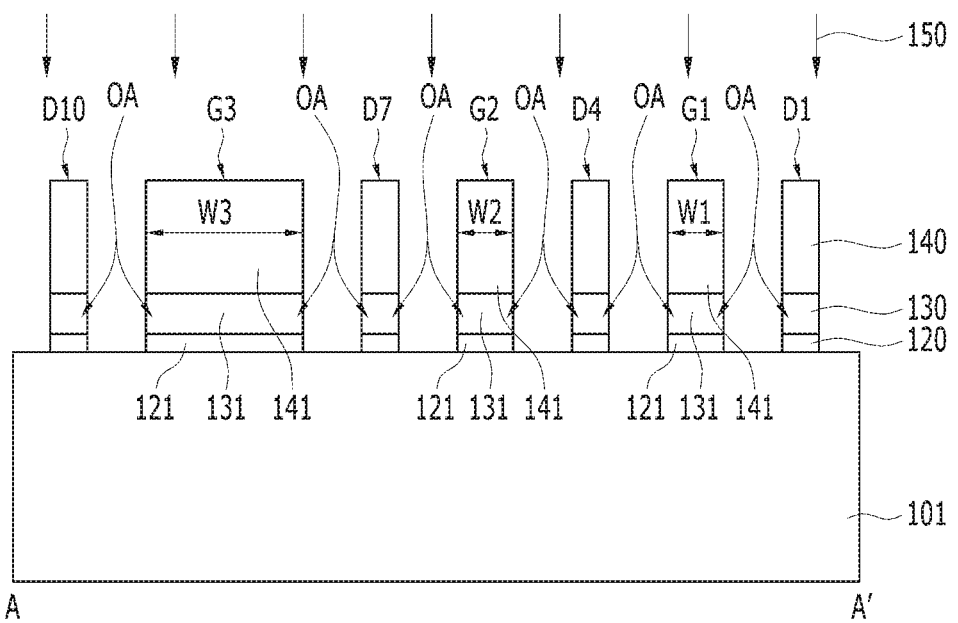
FIG. 1B is a cross-sectional view of the semiconductor device taken along a line A-A' shown in FIG. 1A.

FIG. 1B is a cross-sectional view of the semiconductor device taken along a line A-A' shown in FIG. 1A.

Referring to FIG. 1B, the active gates G1 to G3 and the gate dummies D1, D4, D7 and D10. The active gates G1 to G3 may be spaced apart from each other. The gate dummies D1, D4, D7 and D10 may be spaced apart from each other. The active gates G1 to G3 and the gate dummies D1, D4, D7 and D10 may be spaced apart from each other. The active gates G1 to G3 and the gate dummies D1, D4, D7 and D10 may be arranged in an alternate configuration along a first horizontal direction. The active gates G3 to G1 and the gate dummies D10, D7, D4 and D1 may be arranged in an alternate configuration along a second horizontal direction. The first and second horizontal directions may be substantial perpendicular to each other. The first and second horizontal directions may be parallel to the plane of a semiconductor substrate 101.

The semiconductor substrate 101 may be formed of any suitable semiconductor material including, for example silicon, or silicon germanium. The semiconductor substrate 101 may a Silicon-On-Insulator (SOI) substrate.

Each of the gate dummies D1, D4, D7 and D10 may include a dummy interface layer 120, a dummy gate dielectric layer 130, and a dummy gate electrode 140. The dummy interface layer 120 may be formed over and be in contact with the semiconductor substrate 101. The dummy gate dielectric layer 130 may be formed over and be in contact with the dummy interface layer 120. The dummy gate electrode 140 may be formed over and be in contact with the dummy gate dielectric layer 130.

Each of the active gates G1 to G3 may include an interface layer 121, a gate dielectric layer 131, and a gate electrode 141. The interface layer 121 may be formed over and be in contact with the semiconductor substrate 101. The gate dielectric layer 131 may be formed over and be in contact with the interface layer 121. The gate electrode 141 may be formed over and be in contact with the gate dielectric layer 131.

The dummy interface layer 120 and the interface layer 121 may have the same thickness. The dummy interface layer 120 and the interface layer 121 may be made of the same material. The dummy interface layer 120 and the interface layer 121 may include, for example, a silicon oxide or a silicon oxynitride.

The dummy gate dielectric layer 130 and the gate dielectric layer 131 may be made or include high-k materials. The dummy gate dielectric layer 130 and the gate dielectric layer 131 may have a higher dielectric constant than a dielectric constant of a silicon oxide ($SiO_2$) which is about 3.9. The dummy gate dielectric layer 130 and the gate dielectric layer 131 may have a higher dielectric constant than the dielectric constants of the dummy interface layer 120 and the interface layer 121. The dummy gate dielectric layer 130 and the gate dielectric layer 131 may be made of or include a metal oxide or a metal silicate. For example, the dummy gate dielectric layer 130 and the gate dielectric layer 131 may include hafnium (Hf), aluminum (Al), lanthanum (La), or zirconium (Zr). The dummy gate dielectric layer 130 and the gate dielectric layer 131 may be made of or include a hafnium oxide, an aluminum oxide, a lanthanum oxide, a zirconium oxide, or a combination thereof. The dummy gate dielectric layer 130 and the gate dielectric layer 131 may be made of or include a hafnium silicate (HfSiO), a zirconium silicate (ZrSiO), or a combination thereof. In an embodiment of the present invention, the dummy gate dielectric layer 130 and the gate dielectric layer 131 may be made of or include a hafnium-based material. For example, the dummy gate dielectric layer 130 and the gate dielectric layer 131 may include hafnium oxide ($HfO_2$), hafnium silicate (HfSiO), hafnium silicon oxynitride (HfSiON), or hafnium oxynitride (HfON).

The dummy gate electrode 140 and the gate electrode 141 may have the same thickness. The dummy gate electrode 140 and the gate electrode 141 may be made of or include polysilicon, a metal, a metal nitride, or a combination thereof. For example, the dummy gate electrode 140 and the gate electrode 141 may be made of or include an n-type doped polysilicon, a p-type doped polysilicon, a titanium nitride, a tantalum nitride, tungsten, aluminum, or a combination thereof.

As described above, since the dummy gate dielectric layer 130 and the gate dielectric layer 131 is formed of a high-k material, the dummy gate dielectric layer 130 and the gate dielectric layer 131 may include a plurality of oxygen vacancies. To cure the oxygen vacancies, the active gates G1 to G3 and the gate dummies D1, D4, D7 and D10 may be exposed to a thermal treatment process 150.

The thermal treatment process 150 may be performed in the atmosphere of an oxygen-containing gas. The atmosphere of the oxygen-containing gas may include $O_2$ gas.

While the thermal treatment process 150 is performed, the oxygen atoms in the atmosphere of the oxygen-containing gas may be diffused into the gate dielectric layer 131 and the dummy gate dielectric layer 130. The diffused oxygen atoms may cure the oxygen vacancies of the gate dielectric layer 131 and the dummy gate dielectric layer 130.

In an embodiment of the present invention, the dummy gate dielectric layer 130 may capture oxygen atoms (OA) by forming the gate dummies D1 to D10 each of which includes the dummy gate dielectric layer 130 while the thermal treatment process 150 is performed. Since the oxygen atoms (OA) are captured, the dummy gate dielectric layer 130 may have a higher oxygen amount than the gate dielectric layer 131. The oxygen vacancies of the dummy gate dielectric layer 130 may be cured by the captured oxygen atoms (OA). As a result, the dummy gate dielectric layer 130 and the gate dielectric layer 131 may have different oxygen vacancy densities. In accordance with another embodiment of the present invention, the dummy gate dielectric layer 130 and the gate dielectric layer 131 may have the same oxygen content.

As described above, since the dummy gate dielectric layer 130 captures the oxygen atoms (OA) during the thermal treatment process 150, it is possible to minimize the oxygen atoms (OA) that are diffused into the gate dielectric layer 131. Since the oxygen atoms (OA) are consumed in the dummy gate dielectric layer 130 during the thermal treatment process 150, the amount of oxygen atoms (OA) reaching the active gates G1 to G3 may be minimized. Therefore, it is possible to suppress oxygen vacancy curing in the active gates of different widths and thereby improve the oxygen vacancy uniformity.

Figure 1C:
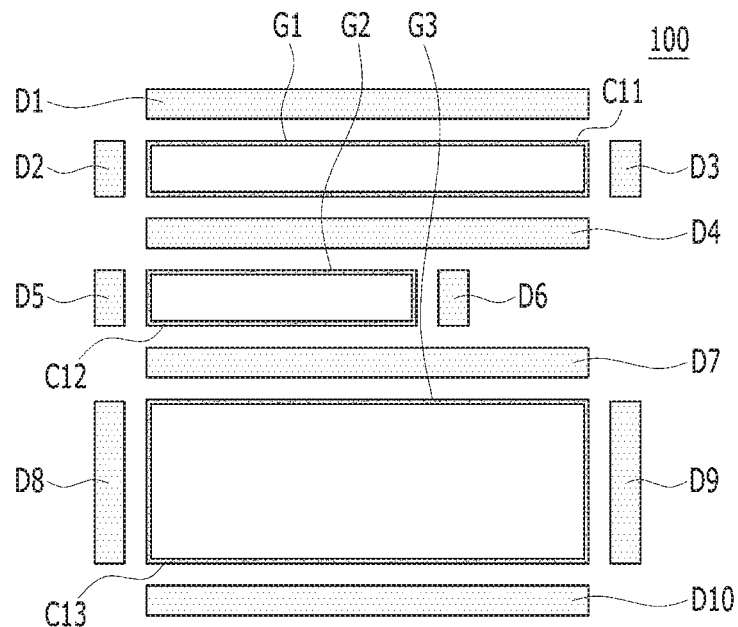
FIGS. 1C and 1D are schematic diagram illustrating an oxygen vacancy curing uniformity.
Figure 1D:
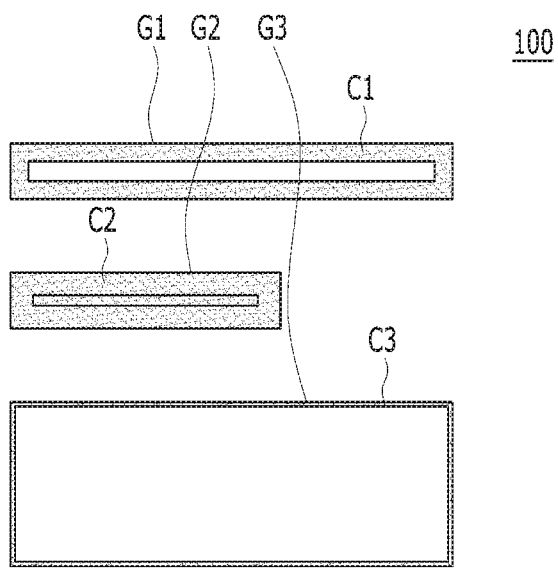

FIGS. 1C and 1D illustrate an oxygen vacancy curing uniformity.

Referring to FIG. 1C, the oxygen vacancies may be cured by the oxygen atoms at the edges of the active gates G1, G2 and G3. Since the gate dummies D1 to D10 capture oxygen atoms, it is possible to minimize the oxygen atoms that reach the edges of the active gates G1, G2 and G3. Therefore, the oxygen vacancy curing regions C11, C12 and C13 of the active gates G1, G2 and G3 may have a uniform size. Each of the active gates G1, G2 and G3 may include oxygen vacancy-containing regions V11, V12 and V13 and the oxygen vacancy curing regions C11, C12 and C13. The oxygen vacancy curing regions C11, C12 and C13 may be limited to the gate edges of the active gates G1, G2 and G3, respectively. The oxygen vacancy-containing regions V11, V12 and V13 may include a plurality of oxygen vacancies, and the oxygen vacancy curing regions C11, C12 and C13 may be the regions where the oxygen vacancies are cured. The oxygen vacancy-containing regions V11, V12 and V13 may have a wider area than the oxygen vacancy curing regions C11, C12 and C13.

In accordance with another embodiment of the present invention, when all the oxygen atoms diffused by the gate dummies D1 to D10 are consumed, the active gates G1, G2 and G3 may not include the oxygen vacancy curing regions C11, C12 and C13.

FIG. 1D illustrates the semiconductor device 100 in accordance with a comparative example. The comparative example of FIG. 1D may be different from FIG. 1C in that the gate dummies may be omitted. The semiconductor device 100 in accordance with the comparative example may be exposed to the thermal treatment process 150 shown in FIG. 1B.

While the thermal treatment process 150 is performed, the oxygen atoms (OA) in the atmosphere of the oxygen-containing gas may be diffused into the gate dielectric layer 131. The diffused oxygen atoms (OA) may cure the oxygen vacancies of the gate dielectric layer 131. However, since the active gates G1, G2 and G3 have different widths, the oxygen vacancy curing density may be ununiform. For example, the oxygen vacancies of the active gates G1 and G2 of narrow widths may be cured more than the oxygen vacancies of the active gate G3 of a wide width. In other words, oxygen vacancy curing regions C1 and C2 of the active gates G1 and G2 may be wider than the oxygen vacancy curing region C3 of the active gate G3. Due to the significant difference between the oxygen vacancy curing regions, there may be a threshold voltage difference between active transistors.

In this embodiment of the present invention, the oxygen vacancy significant difference may not occur between the active gates G1, G2 and G3 of different widths by disposing the gate dummies D1 to D10. After all, the threshold voltage difference and reliability difference between the active transistors of different widths may be removed.

Figure 2:
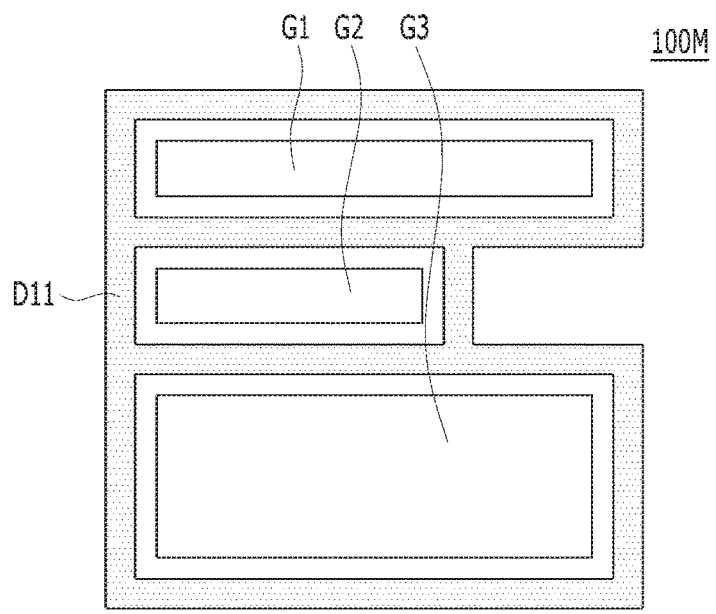
FIG. 2 is a plan view illustrating a semiconductor device in accordance with an embodiment of the present invention.

FIG. 2 is a plan view illustrating a semiconductor device 100M in accordance with an embodiment of the present invention. Hereafter, what overlaps with the above-described embodiments is omitted herein, and the embodiment of the present invention will be described focusing on its differences with the embodiment of FIGS. 1A and 1B.

Referring to FIG. 2, the semiconductor device 100M a single, continuous dummy gate surrounds the active gates G1 to G3. The dummy gate D11 is also referred to hereinafter as a ring-shaped dummy gate D11.

Figure 3A:
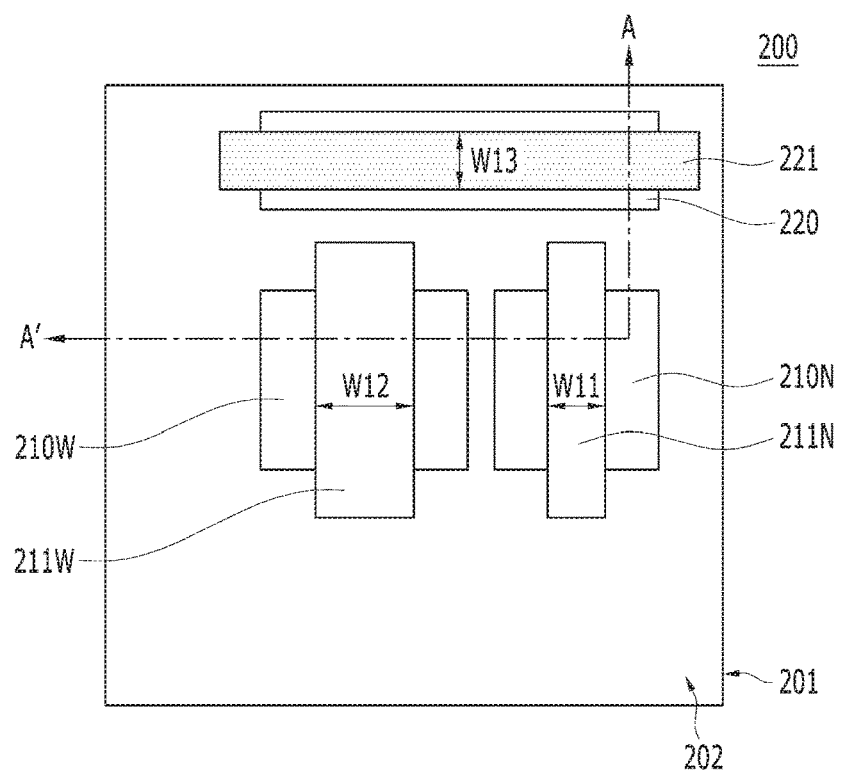
FIG. 3A is a plan view illustrating a semiconductor device in accordance with an embodiment of the present invention.
Figure 3B:
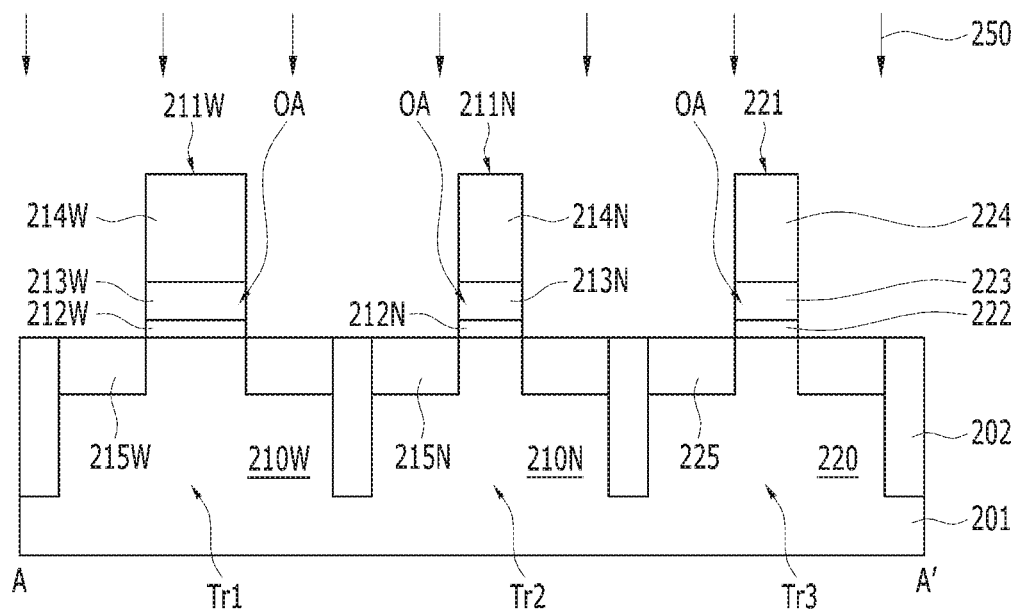
FIG. 3B is a cross-sectional view of the semiconductor device taken along a line A-A' shown in FIG. 3A.

FIG. 3A is a plan view illustrating a semiconductor device in accordance with an embodiment of the present invention. FIG. 3B is a cross-sectional view of the semiconductor device taken along a line A-A' shown in FIG. 3A. Hereafter, what overlaps with the above-described embodiments is omitted herein, and the embodiment of the present invention will be described focusing on any modified portion.

Referring to FIGS. 3A and 3B, the semiconductor device 200 may include a plurality of active transistors Tr1 and Tr2 and one dummy transistor Tr3. The active transistors Tr1 and Tr2 may include a first active transistor Tr1 and a second active transistor Tr2. The first active transistor Tr1 may include a wide gate 211W. The second active transistor Tr2 may include a narrow gate 211N. The wide gate 211W may have a wider width than the narrow gate 211N (W12>W11). The wide gate 211W and the narrow gate 211N may have the same gate length.

The first active transistor Tr1 may include the wide gate 211W and a first source/drain region 215W. The wide gate 211W may be laid over a first active region 210W to be crossed. The first source/drain region 215W may be formed in the inside of the first active region 210W on both sides of the wide gate 211W.

The second active transistor Tr2 may include the narrow gate 211N and a second source/drain region 215N. The narrow gate 211N may be laid over a second active region 210N to be crossed. The second source/drain region 215N may be formed in the inside of the second active region 210N on both sides of the narrow gate 211N.

The dummy transistor Tr3 may include a dummy gate 221 and a dummy source/drain region 225. The dummy gate 221 may be laid over a dummy active region 220 to be crossed. The dummy source/drain region 225 may be formed in the inside of the dummy active region 220 on both sides of the dummy gate 221. The dummy gate 221 may have a narrower width than the wide gate 211W (W13<W12). The dummy gate 221 and the narrow gate 211N may have the same width (W13=W11). In accordance with a variation of this embodiment of the present invention, the dummy gate 221 may have a narrower width than the narrow gate 211N (W13<W11).

The first active region 210W, the second active region 210N, and the dummy active region 220 may be defined by a semiconductor substrate 201. The semiconductor substrate 201 may further include an isolation layer 202. The first active region 210W, the second active region 210N, and the dummy active region 220 may be electrically disconnected from each other by the isolation layer 202.

The wide gate 211W may include a first interface layer 212W, a first gate dielectric layer 213W, and a first gate electrode 214W.

The narrow gate 211N may include a second interface layer 212N, a second gate dielectric layer 213N, and a second gate electrode 214N.

The dummy gate 221 may include a dummy interface layer 222, a dummy gate dielectric layer 223, and a dummy gate electrode 224.

The dummy interface layer 222 may correspond to the dummy interface layer 120. The first interface layer 212W and the second interface layer 212N may correspond to the interface layer 121 shown in FIG. 1B. The first gate dielectric layer 213W and the second gate dielectric layer 213N may correspond to the gate dielectric layer 131 shown in FIG. 1B. The dummy gate dielectric layer 223 may correspond to the dummy gate dielectric layer 130 shown in FIG. 1B. The first gate electrode 214W and the second gate electrode 214N may correspond to the gate electrode 141 shown in FIG. 1B. The dummy gate electrode 224 may correspond to the dummy gate electrode 140 shown in FIG. 1B.

The first source/drain region 215W and the second source/drain region 215N and the dummy source/drain region 225 may be doped with an N-type impurity or a P-type impurity. The first source/drain region 215W and the second source/drain region 215N and the dummy source/drain region 225 may be doped with the same impurity. For example, the first source/drain region 215W and the second source/drain region 215N and the dummy source/drain region 225 may include phosphorus (P), arsenic (As) or boron (B).

The first source/drain region 215W and the second source/drain region 215N and the dummy source/drain region 225 may be doped with different impurities. The first source/drain region 215W and the second source/drain region 215N and the dummy source/drain region 225 may be doped with an N-type impurity. As a result, the first active transistor Tr1, the second active transistor Tr2, and the dummy transistor Tr3 may include an NMOSFET (N-channel Metal Oxide Semiconductor Field Effect Transistor).

The first source/drain region 215W and the second source/drain region 215N and the dummy source/drain region 225 may be doped with a P-type impurity. As a result, the first active transistor Tr1, the second active transistor Tr2, and the dummy transistor Tr3 may include a PMOSFET (P-channel Metal Oxide Semiconductor Field Effect Transistor).

The first source/drain region 215W and the second source/drain region 215N may be doped with an N-type impurity, and the dummy source/drain region 225 may be doped with a P-type impurity. As a result, the first active transistor Tr1 and the second active transistor Tr2 may be NMOSFETs, and the dummy transistor Tr3 may include a PMOSFET.

In this embodiment of the present invention, as the dummy gate 221 including the dummy gate dielectric layer 223 is formed, the dummy gate dielectric layer 223 may capture the oxygen atoms (OA) while a thermal treatment 250 is performed.

As the dummy gate dielectric layer 223 captures the oxygen atoms (OA), which is described above, the amount of the oxygen atoms (OA) diffused into the first gate dielectric layer 213W and the second gate dielectric layer 213N may be minimized. Therefore, no significant oxygen vacancy difference occurs between the first active transistor Tr1 and the second active transistor Tr2.

Also, since the dummy gate 221 captures the oxygen atoms, the oxygen vacancy uniformity between the wide gate 211W and the narrow gate 211N having different channel lengths may be improved. In other words, the threshold voltage between a long channel and a short channel may be maintained uniformly.

After all, since the dummy gate 221 is formed around the wide gate 211W and the narrow gate 211N, the reliability between the first active transistor Tr1 and the second active transistor Tr2 having different gate widths or different channel lengths may be secured uniformly.

The first active transistor Tr1 and the second active transistor Tr2 may include an NMOSFET, a PMOSFET, or a CMOSFET. The dummy transistor Tr3 may include a dummy NMOSFET, a dummy PMOSFET, or a dummy CMOSFET.

Figure 3C:
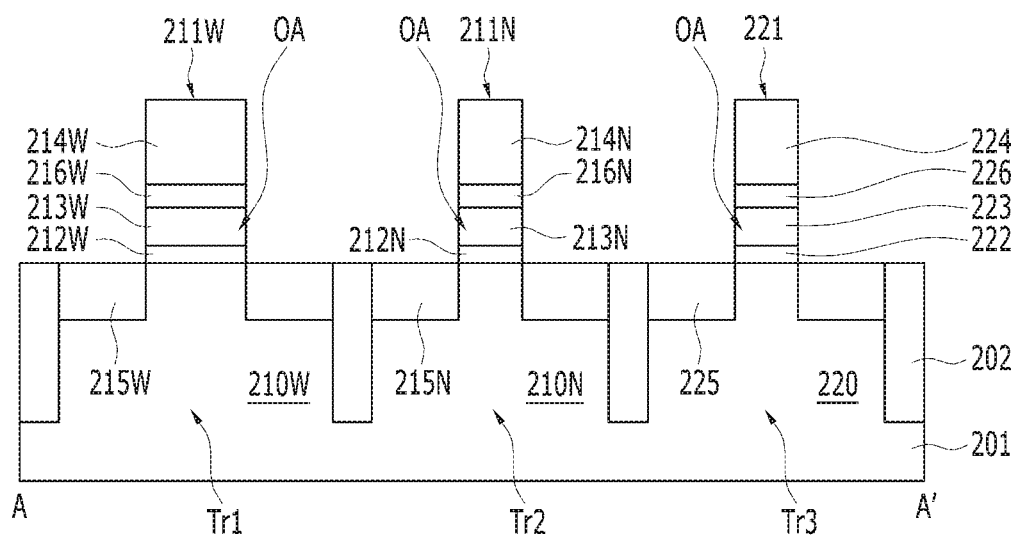
FIG. 3C is a cross-sectional view illustrating a semiconductor device in accordance with a modified example of the third embodiment of the present invention.

FIG. 3C is a cross-sectional view illustrating a semiconductor device in accordance with a modified example of the embodiment of the present invention. Hereafter, what overlaps with the above-described embodiments is omitted herein, and the modified example of the embodiment of the present invention will be described focusing on any modified portion.

Referring to FIG. 3C, the wide gate 211W may further include a first capping layer 216W between the first gate electrode 214W and the first gate dielectric layer 213W. The narrow gate 211N may further include a second capping layer 216N between the second gate electrode 214N and the second gate dielectric layer 213N. The dummy gate 221 may further include a dummy capping layer 226 between the dummy gate electrode 224 and the dummy gate dielectric layer 223.

The first capping layer 216W and the second capping layer 216N may be made of a material capable of controlling a valid work function by inducing dipole. The first capping layer 216W and the second capping layer 216N may include a lanthanum oxide (LaO) or an aluminum oxide (AlO). When the first active transistor Tr1 and the second active transistor Tr2 are NMOSFETs, the first capping layer 216W and the second capping layer 216N may be a lanthanum oxide (LaO). When the first active transistor Tr1 and the second active transistor Tr2 are PMOSFETs, the first capping layer 216W and the second capping layer 216N may be an aluminum oxide (AlO). The first capping layer 216W, the second capping layer 216N, and the dummy capping layer 226 may be made of the same material.

The first capping layer 216W and the second capping layer 216N may control threshold voltages of the first active transistor Tr1 and the second active transistor Tr2 at a required level.

Figure 4A:
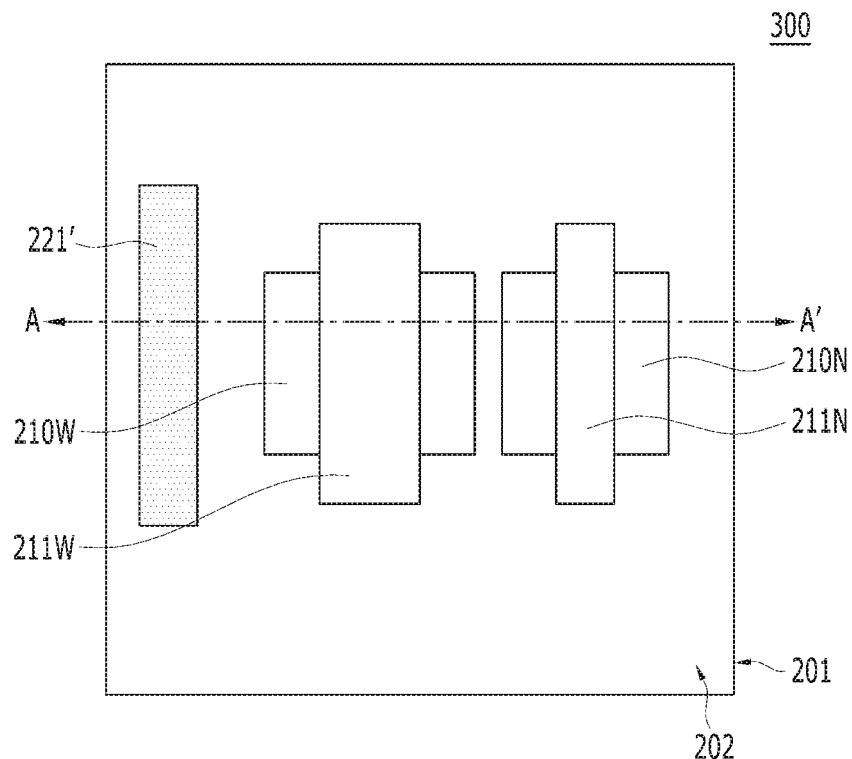
FIG. 4A is a plan view illustrating a semiconductor device in accordance with an embodiment of the present invention.
Figure 4B:
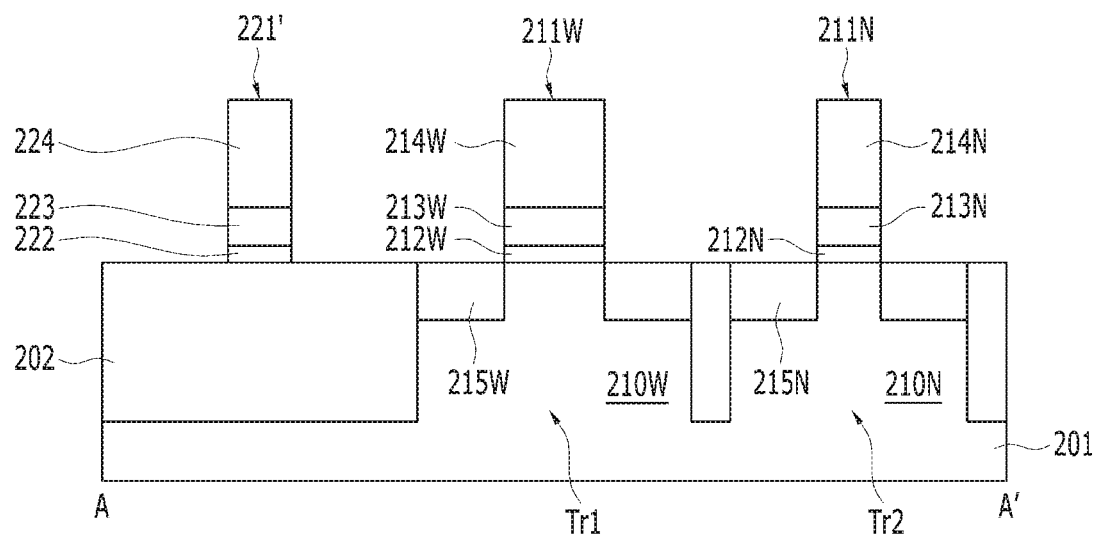
FIG. 4B is a cross-sectional view of the semiconductor device taken along a line A-A' shown in FIG. 4A.

FIG. 4A is a plan view illustrating a semiconductor device 300 in accordance with an embodiment of the present invention. FIG. 4B is a cross-sectional view of the semiconductor device taken along a line A-A' shown in FIG. 4A. Hereafter, what overlaps with the above-described embodiments is omitted herein, and the embodiment of the present invention will be described focusing on any modified portion.

Referring to FIGS. 4A and 4B, the semiconductor device 300 may include a wide gate 211W, a narrow gate 211N, and a dummy gate 221'. The dummy gate 221' may be formed to directly contact the isolation layer 202. In other words, the dummy gate 221' may be disposed over and may be in contact with the isolation layer 202.

Figure 5:
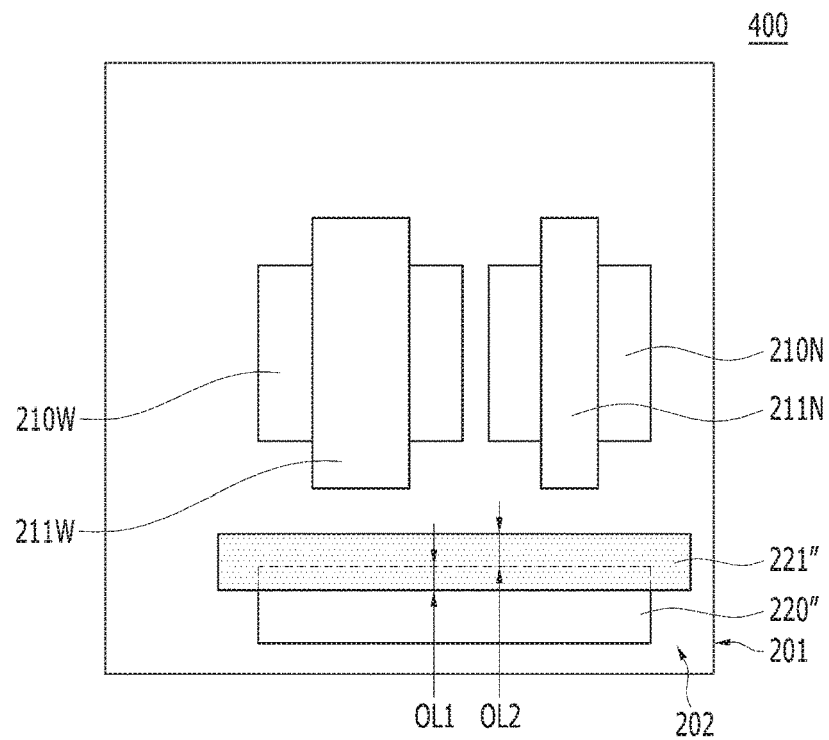
FIG. 5 is a plan view illustrating a semiconductor device in accordance with an embodiment of the present invention.

FIG. 5 is a plan view illustrating a semiconductor device 400 in accordance with an embodiment of the present invention. Hereafter, what overlaps with the above-described embodiments is omitted herein, and the embodiment of the present invention will be described focusing on any modified portion.

Referring to FIG. 5, the semiconductor device 400 may include a wide gate 211W, a narrow gate 211N, and a dummy gate 221". The dummy gate 221" may partially overlap (OL1) with the dummy active region 220". Also, the dummy gate 221" may partially overlap (OL2) with the isolation layer 202.

Figure 6:
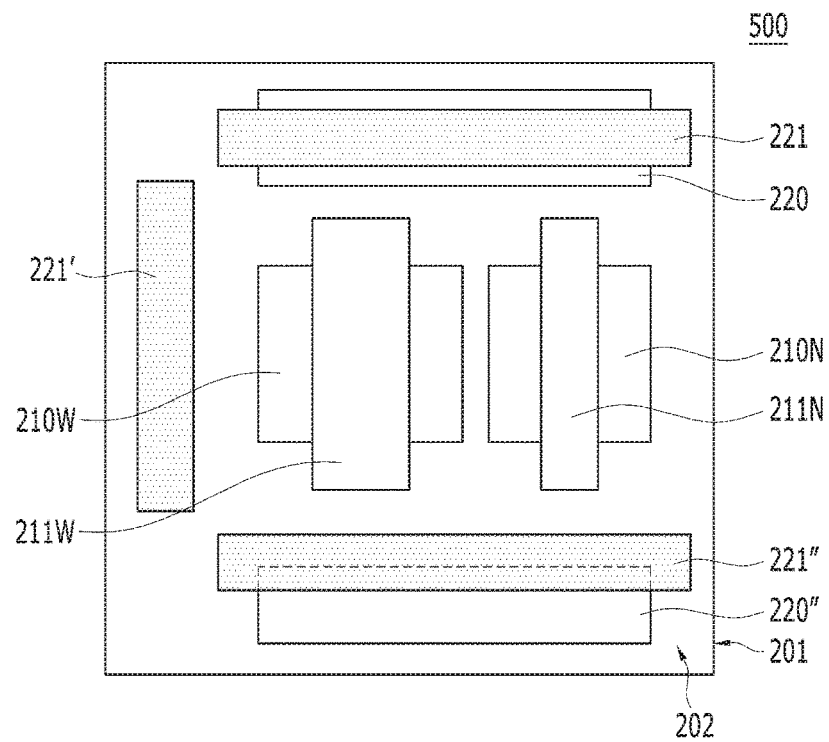
FIG. 6 is a plan view illustrating a semiconductor device in accordance with an embodiment of the present invention.

FIG. 6 is a plan view illustrating a semiconductor device 500 in accordance with an embodiment of the present invention. Hereafter, what overlaps with the above-described embodiments is omitted herein, and the embodiment of the present invention will be described focusing on any modified portion.

Referring to FIG. 6, semiconductor device 500 may include a plurality of gate dummies 221, 221' and 221". The dummy gate 221 may be laid over the dummy active region 220 to be crossed. The dummy gate 221' may be disposed over the isolation layer 202. The dummy gate 221" may partially overlap with the dummy active region 220" and the isolation layer 202.

Figure 7:
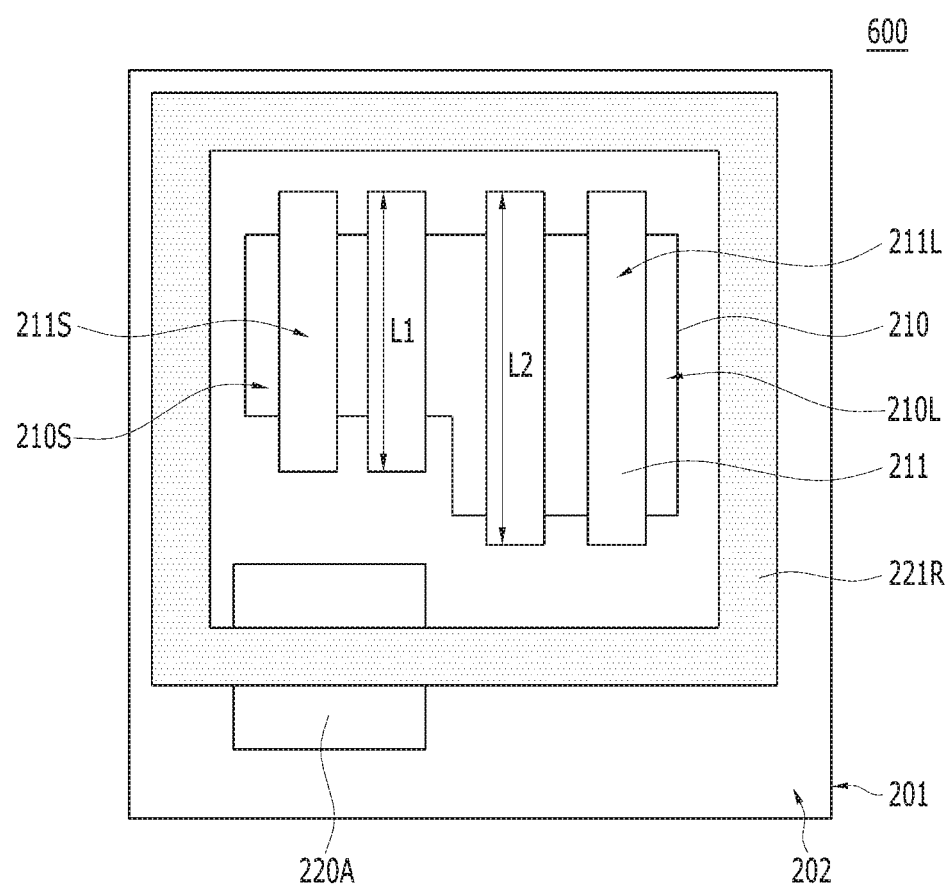
FIG. 7 is a plan view illustrating a semiconductor device in accordance with an embodiment of the present invention.

FIG. 7 is a plan view illustrating a semiconductor device 600 in accordance with an embodiment of the present invention. Hereafter, what overlaps with the above-described embodiments is omitted herein, and the embodiment of the present invention will be described focusing on any modified portion.

Referring to FIG. 7, the semiconductor device 600 may include a plurality of long active gates 211L, a plurality of short active gates 211S and one dummy gate 221R. The dummy gate 221R may have a shape of a ring that surrounds the active gates 211L and 211S. The active gates 211L and 211S may be laid over an active region 210. The active gates 211L and 211S may include a plurality of short active gate 211S and a plurality of long active gate 211L. The length L1 of the short active gate 211S may be shorter than thee length L2 of the long active gate 211L. The short active gate 211S and the long active gate 211L may have the same width. The short active gate 211S may be laid over a short active region 210S to be crossed. The long active gate 211L may be laid over a long active region 210L to be crossed. From the perspective of the direction of the gate length, the long active region 210L may be longer than the short active region 210S.

Most of the dummy gate 221R may be disposed over the isolation layer 202. A portion of the dummy gate 221R may be laid over a dummy active region 220A to be crossed. In accordance with another embodiment of the present invention, the dummy active region 220A may be omitted.

FIGS. 8A to 8E illustrate an example of a method for fabricating the semiconductor devices in accordance with the embodiments of the present invention.

Figure 8A:
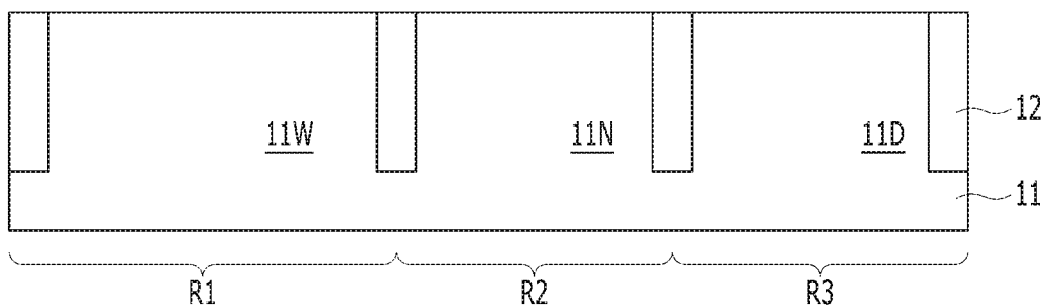
FIGS. 8A to 8E illustrate an example of a method for fabricating the semiconductor devices in accordance with the embodiments of the present invention.

Referring to FIG. 8A, an isolation layer 12 may be formed in a semiconductor substrate 11 to define a plurality of active regions. The semiconductor substrate 11 may be formed of any suitable semiconductor material including, for example, silicon, or a silicon germanium. The semiconductor substrate 11 may be a Silicon-On-Insulator (SOI) substrate. The isolation layer 12 may be formed by a Shallow Trench Isolation (STI) process. The isolation layer 12 may be formed, for example, of a silicon oxide, a silicon nitride, a Spin-On-Dielectric (SOD), or a combination thereof.

The isolation layer 12 may define a first region R1, a second region R2, and a third region R3 in the semiconductor substrate 11. The first region R1, the second region R2, and the third region R3 may be active regions. The first region R1 may be referred to as 'a wide gate region'. The second region R2 may be referred to as 'a narrow gate region'. The third region R3 may be referred to as 'a dummy gate region'. The first region R1 and the second region R2 may be the regions where actually operating transistors are formed. The third region R3 may be a region where a non-operating transistor, that is, a dummy gate region'. The first region R1, the second region R2, and the third region R3 may be active regions.

Figure 8B:
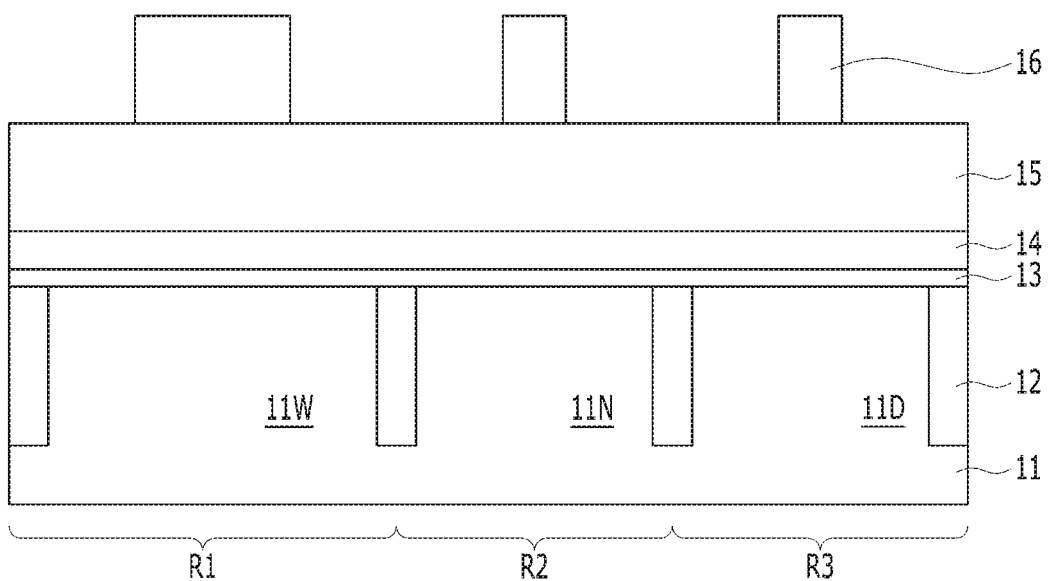

Referring to FIG. 8B, an interface layer 13 may be formed over and be in contact with the semiconductor substrate 11. A gate dielectric layer 14 may be formed over and be in contact with the interface layer 13.

The interface layer 13 may be made of or include a silicon oxide, a silicon oxynitride, or a combination thereof. For example, the interface layer 13 may be made of or include a silicon oxide ($SiO_2$) or a silicon oxynitride (SiON). The interface layer 13 may improve the interface characteristics between the semiconductor substrate 11 and the gate dielectric layer 14. A silicon oxide as the interface layer 13 may grow up through a wet method using ozone. The interface layer 13 may be formed of the same material in the first region R1, the second region R2, and the third region R3.

The gate dielectric layer 14 may be formed of the same material in the first region R1, the second region R2, and the third region R3. The gate dielectric layer 14 may include a high-k material. The dielectric constant of the gate dielectric layer 14 may be higher than the dielectric constant (approximately 3.9) of a silicon oxide ($SiO_2$). The gate dielectric layer 14 may have a higher dielectric constant than the interface layer 13.

The gate dielectric layer 14 may be made of or include a metal oxide or a metal silicate. The gate dielectric layer 14 may be made of or include hafnium (Hf), aluminum (Al), lanthanum (La), or zirconium (Zr). The gate dielectric layer 14 may be made of or include a hafnium oxide, an aluminum oxide, a lanthanum oxide, a zirconium oxide or combination thereof. The gate dielectric layer 14 may be made of or include a hafnium silicate (HfSiO), a zirconium silicate (ZrSiO), or combination thereof. The gate dielectric layer 14 may be formed of different materials in the first region R1 and the second region R2. The gate dielectric layer 14 may be formed by a Chemical Vapor Deposition (CVD) process, a Low-Pressure CVD (LPCVD) process, a plasma-enhanced CVD (PECVD) process, a Metal-Organic CVD (MOCVD) process, an Atomic Layer Deposition (ALD) process, or a Plasma-Enhanced ALD (PEALD). Although not illustrated, the gate dielectric layer 14 may be exposed to a plasma nitridation process and a post-nitridation annealing process.

A gate conductive layer 15 may be formed over and be in contact with the gate dielectric layer 14. The gate conductive layer 15 may be formed of the same material in the first region R1, the second region R2, and the third region R3. The gate conductive layer 15 may be made of or include polysilicon, a metal, a metal nitride, or a combination thereof. For example, the gate conductive layer 15 may be made of or include an n-type doped polysilicon, a p-type doped polysilicon, a titanium nitride, a tantalum nitride, tungsten, aluminum, or a combination thereof.

A mask layer 16 may be formed over and be in contact with the gate conductive layer 15. The mask layer 16 may include a photoresist pattern.

Figure 8C:
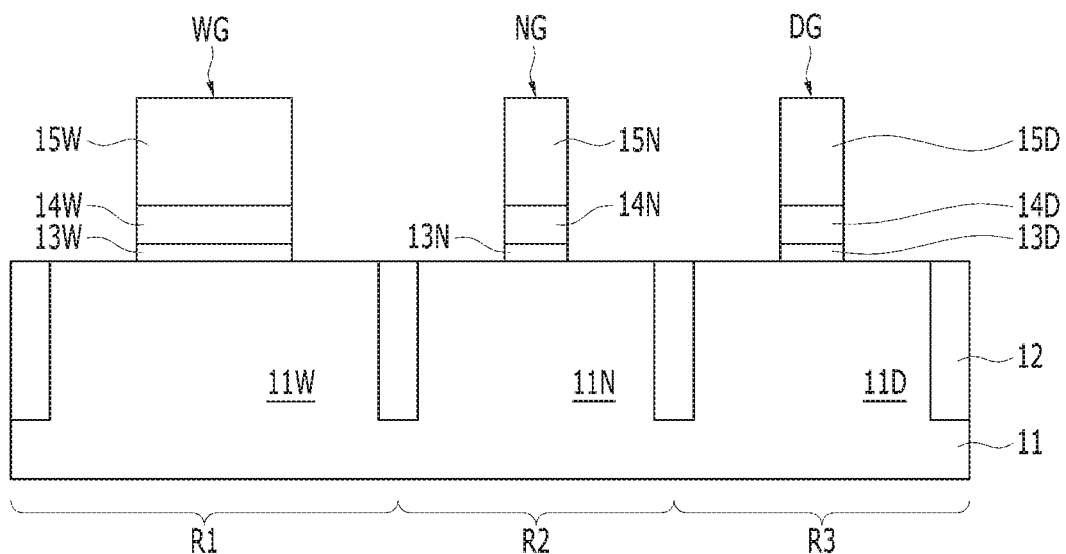

Referring to FIG. 8C, a wide gate WG, a narrow gate NG, and a dummy gate DG may be formed. The wide gate WG, the narrow gate NG, and the dummy gate DG may be formed concurrently. To form the wide gate WG, the narrow gate NG, and the dummy gate DG, a gate patterning process may be performed using the mask layer 16. For example, the gate conductive layer 15, the gate dielectric layer 14, and the interface layer 13 may be sequentially etched.

Each of the wide gate WG, the narrow gate NG, and the dummy gate DG may have a stacked structure of multiple layers. The wide gate WG may have a structure where a wide interface layer 13W, a wide gate dielectric layer 14W, and a wide gate electrode 15W are stacked. The narrow gate NG may have a structure where a narrow interface layer 13N, a narrow gate dielectric layer 14N, and a narrow gate electrode 15N are stacked. The dummy gate DG may have a stacked structure including a dummy interface layer 13D, a dummy gate dielectric layer 14D, and a dummy gate electrode 15D. The wide interface layer 13W, the narrow interface layer 13N, and the dummy interface layer 13D may be formed of the same material and may have the same thickness. The wide gate dielectric layer 14W, the narrow gate dielectric layer 14N, and the dummy gate dielectric layer 14D may be formed of the same material and may have the same thickness. The wide gate electrode 15W, the narrow gate electrode 15N, and the dummy gate electrode 15D may be formed of the same material and may have the same thickness.

The wide gate WG may be formed over and be in contact with the first region R1. The narrow gate NG may be formed over and be in contact with the second region R2. The dummy gate DG may be formed over and be in contact with the third region R3. The wide gate WG may have a wider width than the narrow gate NG and the dummy gate DG. The wide gate WG and the narrow gate NG may be active gates.

The wide gate WG and the narrow gate NG may be a stack of $SiO_2$/$HfO_2$/TiN. For example, the wide interface layer 13W and the narrow interface layer 13N may be of $SiO_2$. The wide gate dielectric layer 14W and the narrow gate dielectric layer 14N may be of $HfO_2$. The wide gate electrode 15W and the narrow gate electrode 15N may be of TiN.

The dummy gate DG may be a stack of $SiO_2$/$HfO_2$/TiN. In the stack, $SiO_2$ may be the dummy interface layer 13D, and $HfO_2$ may be the dummy gate dielectric layer 14D, and TiN may be the dummy gate electrode 15D.

After the gate patterning process ends, the mask layer (which is the mask layer 16 shown in FIG. 8B) may be removed.

Figure 8D:
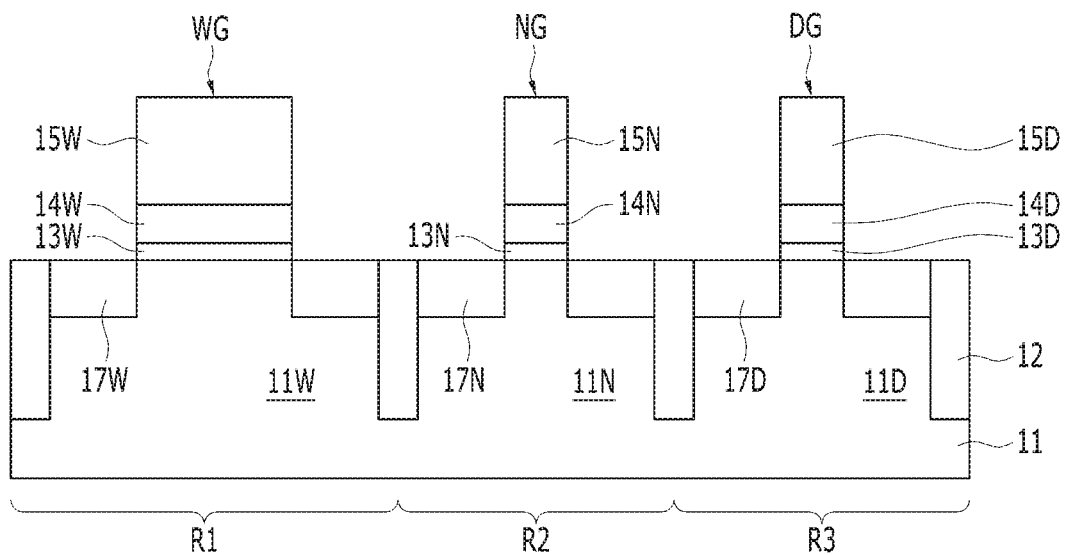

Referring to FIG. 8D, a source/drain region 17W, 17N and 17D may be formed. The source/drain region 17W, 17N and 17D may include a wide source/drain region 17W, a narrow source/drain region 17N, and a dummy source/drain region 17D. The wide source/drain region 17W, the narrow source/drain region 17N, and the dummy source/drain region 17D may be formed by a doping process. The wide source/drain region 17W, the narrow source/drain region 17N, and the dummy source/drain region 17D may be doped with the same impurity. In accordance with another embodiment of the present invention, the wide source/drain region 17W, the narrow source/drain region 17N, and the dummy source/drain region 17D may be doped with a different impurity.

The wide source/drain region 17W, the narrow source/drain region 17N, and the dummy source/drain region 17D may be doped with an N-type impurity or a P-type impurity. The wide source/drain region 17W, the narrow source/drain region 17N, and the dummy source/drain region 17D may be doped with an N-type impurity. The wide source/drain region 17W, the narrow source/drain region 17N, and the dummy source/drain region 17D may be doped with a P-type impurity. The wide source/drain region 17W and the narrow source/drain region 17N may be doped with an N-type impurity, and the dummy source/drain region 17D may be doped with a P-type impurity.

The wide source/drain region 17W, the narrow source/drain region 17N, and the dummy source/drain region 17D may include phosphorus (P), arsenic (As), or boron (B).

The wide gate WG and the wide source/drain region 17W may be a wide gate transistor. The narrow gate NG and the narrow source/drain region 17N may be a narrow gate transistor. The dummy gate DG and the dummy source/drain region 17D may be a dummy transistor. The wide gate transistor and the narrow gate transistor may have the same threshold voltage.

Figure 8E:
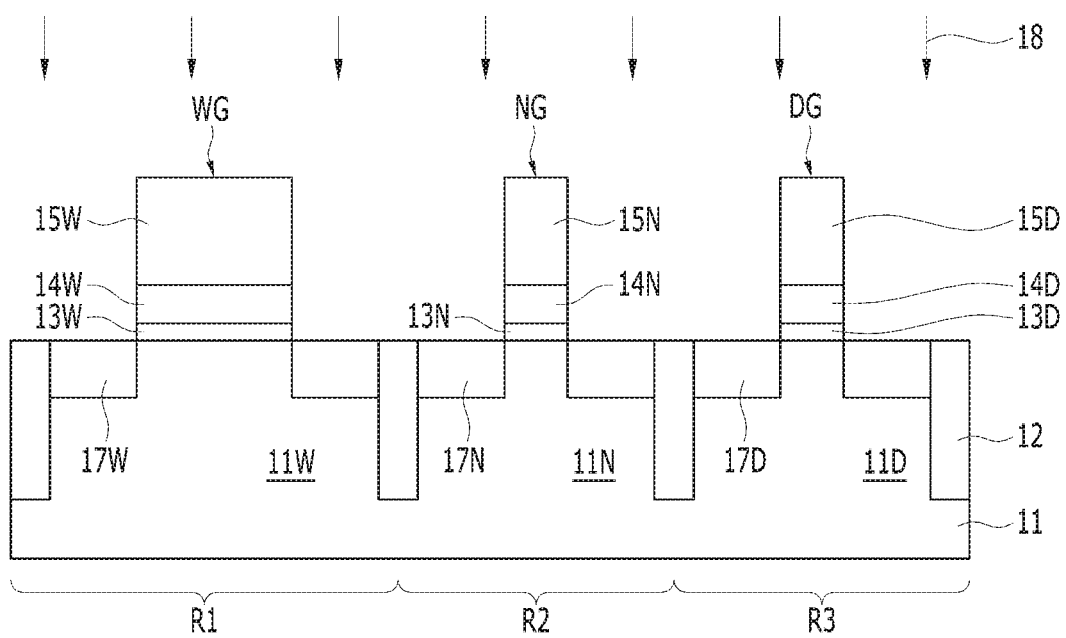

Referring to FIG. 8E, a thermal treatment process 18 may be performed. The thermal treatment process 18 may enable the impurities doping the wide source/drain region 17W, the narrow source/drain region 17N, and the dummy source/drain region 17D.

The thermal treatment process 18 may be performed in the atmosphere of an oxygen-containing gas. The oxygen-containing gas may include oxygen ($O_2$) gas.

The thermal treatment process 18 may cure oxygen vacancies. Herein, the oxygen vacancies may be disposed in the wide gate dielectric layer 14W, the narrow gate dielectric layer 14N, and the dummy gate dielectric layer 14D. Since the wide gate dielectric layer 14W, the narrow gate dielectric layer 14N, and the dummy gate dielectric layer 14D include a high-k material, a plurality of oxygen vacancies may be formed in the wide gate dielectric layer 14W, the narrow gate dielectric layer 14N, and the dummy gate dielectric layer 14D.

While the thermal treatment process 18 is performed, oxygen atoms in the atmosphere of the oxygen-containing gas may be diffused into the wide gate dielectric layer 14W, the narrow gate dielectric layer 14N, and the dummy gate dielectric layer 14D. The diffused oxygen atoms may cure the oxygen vacancies.

in accordance with another embodiment of the present invention, after the thermal treatment process 18 is performed, the wide source/drain region 17W, the narrow source/drain region 17N, and the dummy source/drain region 17D may be formed. In this case, an additional thermal treatment for enabling the impurities doped in the wide source/drain region 17W, the narrow source/drain region 17N, and the dummy source/drain region 17D may be performed. The additional thermal treatment may be performed under the same condition of the thermal treatment process 18.

While the thermal treatment process 18 is performed, the dummy gate DG may capture oxygen atoms. The dummy gate DG may be referred to as 'an oxygen sink dummy'. Since the dummy gate DG captures oxygen atoms, the amount of oxygen atoms diffused into the wide gate WG and the narrow gate NG may be minimized.

Since the dummy gate DG captures oxygen atoms, oxygen vacancy significant difference may not occur. In short, the oxygen vacancy uniformity between the wide gate WG and the narrow gate NG having different widths may be improved. In addition, a threshold voltage between the wide transistor and the narrow transistor may be maintained uniformly.

Since the dummy gate DG used as the oxygen sink dummy has oxygen vacancies formed in the dummy gate dielectric layer 14D, NMOS/PMOS may be used as it is.

Since the oxygen vacancy generation amount increases when the dummy gate dielectric layer 14D and the dummy gate electrode 15D contact each other directly, the function of an oxygen sink may be performed more strongly.

In accordance with the embodiments of the present invention, it is possible to uniformly cure the oxygen vacancies by forming an oxygen sink dummy.

In accordance with the embodiments of the present invention, it is possible to obtain a threshold voltage uniformity between a wide gate transistor and a narrow gate transistor by forming an oxygen sink dummy.

In accordance with the embodiments of the present invention, it is possible to obtain a threshold voltage uniformity between a long channel transistor and a short channel transistor by forming an oxygen sink dummy.

In accordance with the embodiments of the present invention, the reliability of transistors having gates of various widths and lengths may be improved.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a first gate stack including a first gate dielectric layer;
   a second gate stack including a second gate dielectric layer, wherein the second gate stack having a narrower width than the first gate stack;

a first dummy gate stack surrounding side surfaces of the first gate stack;
a second dummy gate stack surrounding side surfaces of the second gate stack,
wherein each of the first and second dummy gate stack includes an oxygen sink layer for capturing oxygen atoms that are diffused from an exterior into the first gate dielectric layer and the second gate dielectric layer, and
wherein the oxygen sink layer has a higher oxygen amount than the first and second gate dielectric layer.

2. The semiconductor device of claim 1, wherein each of the first gate stack, the second gate stack, the first dummy gate stack and the second dummy gate stack includes an oxygen vacancy containing layer, and there is no oxygen vacancy significant difference between the first gate stack and the second gate stack.

3. The semiconductor device of claim 1, wherein the first and second dummy gate stack is formed of the same material as materials of the first gate stack and the second gate stack.

4. The semiconductor device of claim 1, wherein each of the first gate stack and the second gate stack includes an oxygen vacancy containing region and an oxygen vacancy curing region.

5. The semiconductor device of claim 4, wherein the oxygen vacancy curing region is formed in a gate edge of each of the first gate stack and the second gate stack.

6. The semiconductor device of claim 1, wherein each of the first gate dielectric layer, the second gate dielectric layer, and the oxygen sink layer includes a high-k material.

7. The semiconductor device of claim 1, wherein each of the first gate dielectric layer, the second gate dielectric layer, and the oxygen sink layer includes $HfO_2$, HfSiO, HfSiON, or HfON.

8. The semiconductor device of claim 1, wherein each of the first gate stack, the second gate stack, the first dummy gate stack and the second dummy gate stack includes a stacked structure where an interface layer, a high-k material, and a metal gate electrode are sequentially stacked, and
the high-k material of the dummy gate stack becomes the oxygen sink layer.

9. The semiconductor device of claim 1, wherein each of the first gate stack, the second gate stack, the first dummy gate stack and the second dummy gate stack includes a stacked structure where an interface layer, a high-k material, a dipole inducing capping layer, and a metal gate electrode are sequentially stacked, and
the high-k material of the dummy gate stack becomes the oxygen sink layer.

10. The semiconductor device of claim 1, wherein the first dummy gate stack has a continuous shape surrounding the side surfaces of the first gate stack and the second dummy gate stack has a continuous shape surrounding the side surfaces of the second gate stack.

11. The semiconductor device of claim 1, wherein the first and second dummy gate stack is disposed to be spaced apart from the first gate stack and the second gate stack by approximately 1nm to 100 nm.

12. The semiconductor device of claim 1, wherein the first gate stack and the second gate stack have different gate lengths.

13. A method for fabricating a semiconductor device, comprising:
forming an active gate stack over a semiconductor substrate;
forming a dummy gate stack around the active gate stack; and
performing a thermal treatment in an atmosphere of an oxygen gas to cure oxygen vacancies of the active gate stack,
wherein the dummy gate stack includes an oxygen sink layer capturing oxygen atoms that are diffused from the atmosphere of the oxygen gas.

14. The method of claim 13, wherein the forming of the active gate stack includes:
forming a wide gate stack; and
forming a narrow gate stack having a narrower width than the wide gate stack.

15. The method of claim 13, wherein the dummy gate stack is formed to have a shape of surrounding the active gate stack.

16. The method of claim 13, wherein each of the first gate stack, the second gate stack, and the oxygen sink layer includes an oxygen vacancy containing region, and a portion of the oxygen vacancies is cured after the performing of the thermal treatment.

17. The method of claim 13, wherein after the performing of the thermal treatment,
the first gate stack and the second gate stack include an oxygen vacancy containing region and an oxygen vacancy curing region, and
the oxygen vacancy curing region is formed to be limited to a gate edge of each of the first gate stack and the second gate stack.

18. The method of claim 13, wherein each of the first gate stack, the second gate stack, and the dummy gate stack includes a stacked structure where an interface layer, a high-k material, and a metal gate electrode are sequentially stacked.

19. The method of claim 13, wherein each of the first gate stack, the second gate stack, and the dummy gate stack includes a stacked structure where an interface layer, a high-k material, a dipole inducing capping layer, and a metal gate electrode are sequentially stacked.

20. The method of claim 13, wherein the dummy gate stack is disposed to be spaced apart from the first gate stack and the second gate stack by approximately 1nm to 100 nm.

21. The semiconductor device of claim 1, wherein each of the first and second dummy gate stack comprises a plurality of dummy gates spaced apart from each other by a predetermined gap and which are electrically insulated from the first and second gate stacks.

22. The semiconductor device of claim 21, wherein at least one of the plurality of dummy gates surrounding the first and second gate stacks partially overlaps with a dummy active region.

23. The semiconductor device of claim 21, wherein at least one of the plurality of dummy gates surrounding the first and second gate stacks is coupled with an isolation layer.

24. A semiconductor device, comprising:
a first gate stack including a first gate dielectric layer;
a second gate stack including a second gate dielectric layer, wherein the second gate stack having a narrower width than the first gate stack; and
a first dummy gate stack surrounding side surfaces of the first gate stack;
a second dummy gate stack surrounding side surfaces of the second gate stack,
wherein each of the first and second dummy gate stack includes an oxygen sink layer made of a high-K material for capturing oxygen atoms that are diffused from an exterior into the first and second gate stacks during a thermal treatment of the semiconductor device in an oxygen-containing gas atmosphere, and wherein the oxygen sink layer has a higher oxygen amount than the first and second gate dielectric layer.

25. The semiconductor device of claim 1, wherein the oxygen sink layer has an oxygen vacancy density different from that of the first and second gate dielectric layer.

* * * * *